(12) United States Patent
Blattner et al.

(10) Patent No.: US 7,478,454 B2
(45) Date of Patent: *Jan. 20, 2009

(54) MANIPULATING DEVICE FOR PHOTOMASKS THAT PROVIDES POSSIBILITIES FOR CLEANING AND INSPECTION OF PHOTOMASKS

(75) Inventors: Jakob Blattner, Ermatingen (CH); Rudy Federici, Berg (CH)

(73) Assignee: Brooks Automation, Inc., Chelmsford, MA (US)

( * ) Notice: Subject to any disclaimer, the term of this patent is extended or adjusted under 35 U.S.C. 154(b) by 389 days.

This patent is subject to a terminal disclaimer.

(21) Appl. No.: 10/628,294

(22) Filed: Jul. 28, 2003

(65) Prior Publication Data
US 2004/0111823 A1    Jun. 17, 2004

(30) Foreign Application Priority Data
Jul. 29, 2002    (CH) .................................... 1330/02

(51) Int. Cl.
*B08B 6/00* (2006.01)
(52) U.S. Cl. .................. 15/303; 15/306.1; 15/309.2; 15/345; 15/405; 134/1.3; 134/133; 134/137; 134/200
(58) Field of Classification Search .............. 15/301, 15/303, 306.1, 309.2, 345, 346, 405; 134/1.3, 134/102.1, 133, 137, 200; *B08B 6/00*
See application file for complete search history.

(56) References Cited

U.S. PATENT DOCUMENTS

| | | | |
|---|---|---|---|
| 5,846,338 A | 12/1998 | Bonora et al. ................. | 734/11 |
| 6,115,867 A | 9/2000 | Nakashima et al. ............ | 15/77 |
| 6,431,185 B1 | 8/2002 | Tomita et al. ................. | 134/1.3 |
| 6,629,538 B2 | 10/2003 | Yokogawa et al. ........... | 134/1.2 |
| 6,656,017 B2 * | 12/2003 | Jackson ....................... | 451/39 |
| 7,047,984 B2 * | 5/2006 | Blattner et al. ............... | 134/1.3 |
| 2002/0092121 A1 | 7/2002 | Momonoi et al. ............. | 15/345 |

FOREIGN PATENT DOCUMENTS

WO    WO 02/01292 A1    1/2002

OTHER PUBLICATIONS

Patent Abstracts of Japan, vol. 1999, No. 12, Oct. 1999, Publication No. 11-202473, date Jul. 30, 1999, Dainippon Printing Co Ltd.

* cited by examiner

*Primary Examiner*—David A Redding
(74) *Attorney, Agent, or Firm*—Richard Pickreign; Perman & Green, LLP

(57) ABSTRACT

A detection/cleaning device for reticles employed in the production of electronic components, wherein the detection/cleaning device has a cleaning unit, in which a cleaning chamber is constructed. At least one gas feed for introducing a pressurized fluid cleaning medium opens into the cleaning chamber, and at least one suction means, by means of which the gas can be discharged from the cleaning chamber, leads from the cleaning chamber. The cleaning chamber has at least one first opening for introducing and removing a reticle. A detection unit for detecting contaminants on articles used in semiconductor production is provided. The detection unit has a detection means, into which a reticle can be introduced from one feed side of the detection unit. The first opening of the cleaning chamber and the feed side lie opposite each other. A feeding device is provided for exchanging a reticle between the cleaning unit and the detection unit.

7 Claims, 17 Drawing Sheets

Figure 1:
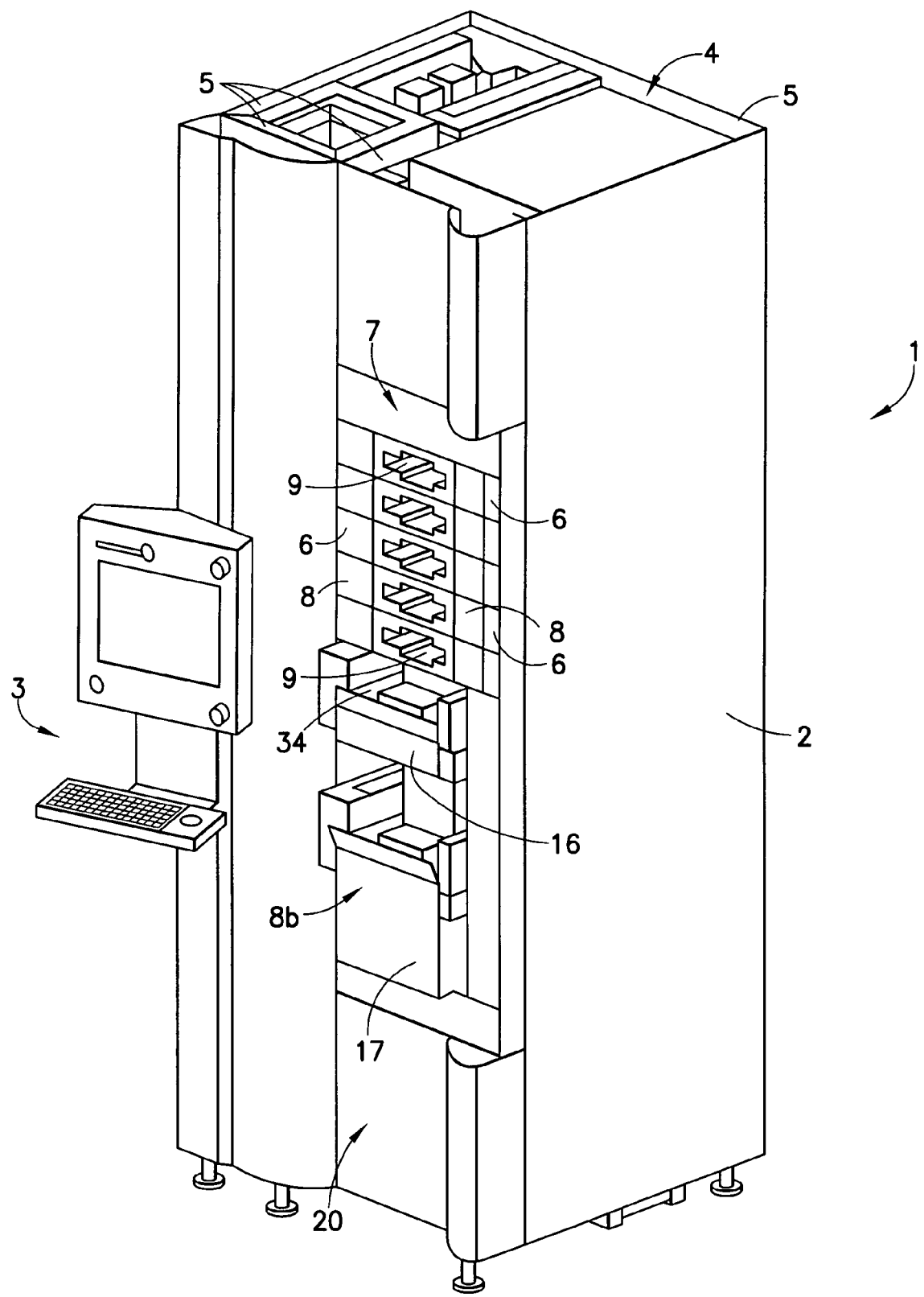

MANIPULATING DEVICE FOR PHOTOMASKS THAT PROVIDES POSSIBILITIES FOR CLEANING AND INSPECTION OF PHOTOMASKS

The invention refers to a detection/cleaning device for reticles employed in the production of electronic components, this device being provided with a detection unit for inspecting reticles for possible contamination or damage as well as with a cleaning unit for the elimination of contaminants from the recticles.

Used in the production of electronic components, such as, for example, chips or memory modules, are exposure masks (also called photomasks or reticles), by means of which specific structures can be produced on component substrates by photochemical processes. Because these structures have conductor tracks in the micrometer or even nanometer range and even the smallest contamination of the substrate and/or of the photomask leads to rejects, that is, products that do not comply with the quality requirements, the highest degree of cleanness is required. Therefore, the production of such components takes place under clean-room or ultra-clean-room conditions. In order to protect the photomasks from mechanical damage and from contamination, they are stored and handled in cassettes or in airtight, sealed magazines.

Larger particles can readily be detected and eliminated. Problematic are smaller particles, such as, for example, those with dimensions of 10 µm to 20 µm, which, until now, could only be eliminated at very great expense. Developed for this were cleaning processes in which the article used in semiconductor production or the corresponding components or their starting products were washed with a fluid. On the one hand, these cleaning processes necessitate a relatively great expense in terms of construction of the requisite apparatus or equipment. Included here is also the fact that the reticles have to be placed in and taken out of such a, usually separate, piece of equipment. On the other hand, the washing fluids used have to be reprocessed or replaced by fresh fluids.

Therefore, cleaning processes have already been developed in which cleaning is performed by means of a gaseous medium. An example of this is the reticle cleaning device shown in U.S. Pat. No. 6,055,742, in which a gas feeding device in the upper region of the cleaning chamber as well as a door device and a transport device for feeding in the reticle are provided. Because such a device allows only one side of the reticle to be cleaned—because, owing to the design, the reticle is fixed in place in the cleaning chamber—there results the drawback of a large footprint when a second cleaning device for the second side is to be provided.

The patent WO 02/01292 A1, which comes from the same Applicant, therefore shows a detection device for the inspection of reticles, this device being integrated in a stocking device. A cleaning device that is spatially separate from this has a cleaning chamber, in which both sides of a reticle can be cleaned at the same time by means of an ionized gas. In order to transfer a reticle from the cleaning chamber to the detection device, the reticle has to pass through three different feeding devices and, in so doing, be conveyed in each case from one feeding device to the next feeding device.

In Patent Abstracts of Japan, European Patent Office, in regard to JP A 03 [1991] 155,550 is a cleaning device is described, which is employed when contamination of a photomask is detected by a detection device. To this end, the photomasks are positioned by an X-Y carriage with the contamination under a nozzle. Through the nozzle, nitrogen gas is directed only locally at the contamination in order to remove it. Subsequently, detection is performed again in order to determine whether the contamination could indeed actually be eliminated. However, the fact that the elimination of several particles demands much time can be regarded as a drawback of this device. Moreover, the danger is great here that the particle will settle back onto another site of the photomask. Finally, at least two axes of movement are required for the cleaning device alone.

Essentially the same drawbacks also apply to JP A 04[1992] 151,153. Described here is a device and a corresponding process in which, in a scanning mode of operation, a compressed gas is conducted onto one surface of a semiconductor product to be checked in order to distinguish in functional terms between defects in the semiconductor product and contaminating particles on the latter.

Finally, JP A 06[1994] 168,864 also shows simply a cleaning device in which at least two axes of movement are required just for feeding a reticle into a cleaning chamber. In the cleaning chamber, nitrogen is blown onto one surface of a reticle by means of a gas shower, whereby dust is eliminated from the surface and, at the same time, the charge buildup is removed from the surface by the nitrogen gas.

Known from U.S. Pat. No. 4,715,392 is a washing and cleaning device for semiconductor products. In it, foreign particles are washed with a cleaning fluid from the surface of a reticle. Afterwards, the semiconductor product is passed to an inspection device for foreign particles and then, if need be, conveyed back into the one washing and cleaning device. For these operations, at least four different feeding devices are provided.

Here is where the invention comes in, it being based on the object of providing measures with which rejects, formed on account of contaminants, can be reduced with as little expense as possible in the production of semiconductor components. According to one feature of the invention, as little floor space as possible is to be required for devices according to the invention and it is to be possible to carry out the cleaning efficiently.

The object is attained according to the invention by means of a detection/cleaning device for reticles employed in the production of electronic components, this device having a cleaning unit, in which a cleaning chamber is constructed, wherein at least one gas feed for introducing a pressurized-fluid cleaning medium opens into the cleaning chamber and at least one suction means, by means of which the gas can be discharged from the cleaning chamber, leads from the cleaning chamber. The cleaning chamber has at least one first opening for introducing and removing a reticle. Furthermore, the detection/cleaning device is provided with a detection unit for detecting contaminants on articles used in semiconductor production, wherein, to this end, the detection unit has a detection means, to which a reticle can be introduced from one feed side of the detection unit, wherein the first opening of the cleaning chamber and the feed side lie opposite each other. A feeding device of the detection/cleaning device is provided solely for exchanging a reticle between the cleaning unit and the detection unit.

Accordingly, the invention is based on the concept of arranging the cleaning unit and the detection unit as close to each other in space as possible. In reticle manipulating equipment of the prior art, these structural components are always separated from each other. Therefore, for transporting a reticle from one of the two structural components to the other in each case, several feeding devices and/or feeding devices with several axes of movement have, as a rule, been required as well.

According to the invention, the cleaning and detection of dirt particles is regarded as a combined manipulating operation. If dirt particles are detected, then a cleaning of the reticle in the cleaning unit should also take place immediately. Preferably, detection is then once again carried out for remaining dirt particles and it is determined whether the preceding cleaning operation has been successful. Because the respective reticle accordingly has to be switched between the detection unit and the cleaning unit one time and often several times, these structural components should stand as close to each other as possible.

Through very short transport paths, it is possible to avoid time losses in the, in itself, unproductive manipulating between the two structural components. In addition, the compact construction dictated by this saves cost-intensive floor space. Finally, the arrangement of the two structural components in immediate proximity to each other offers, as a further advantage, also the use of a feeding device that is simple in design.

The shorter the stretch required for transfer, the more likely a feeding device preferred according to the invention can be utilized, this device having only one axis of movement.

In a preferred embodiment, it can be provided that the cleaning chamber is mounted on a housing or rack of the detection unit. Although, in this way, the components, namely, the detection unit and the cleaning unit, are separated from each other and do not mutually impair each other, there result nonetheless especially short manipulating paths.

If such a detection/cleaning device is integrated in a reticle manipulating device with further functional units (such as, for example, a stocking device for the reticles), then the detection/cleaning device can be placed on a rack of the manipulating device through only a few points of attachment. A mounting and alignment of each individual component can be avoided in this way. Even the feeding device, with which the reticles are transferred from the detection unit to the cleaning unit and vice versa can be placed on the cleaning unit and/or detection unit. Accordingly, the construction expense required for its integration into the manipulating device can also be avoided.

Further preferred embodiments of the invention result from the dependent claims, the description, and the figures.

Figure 2:
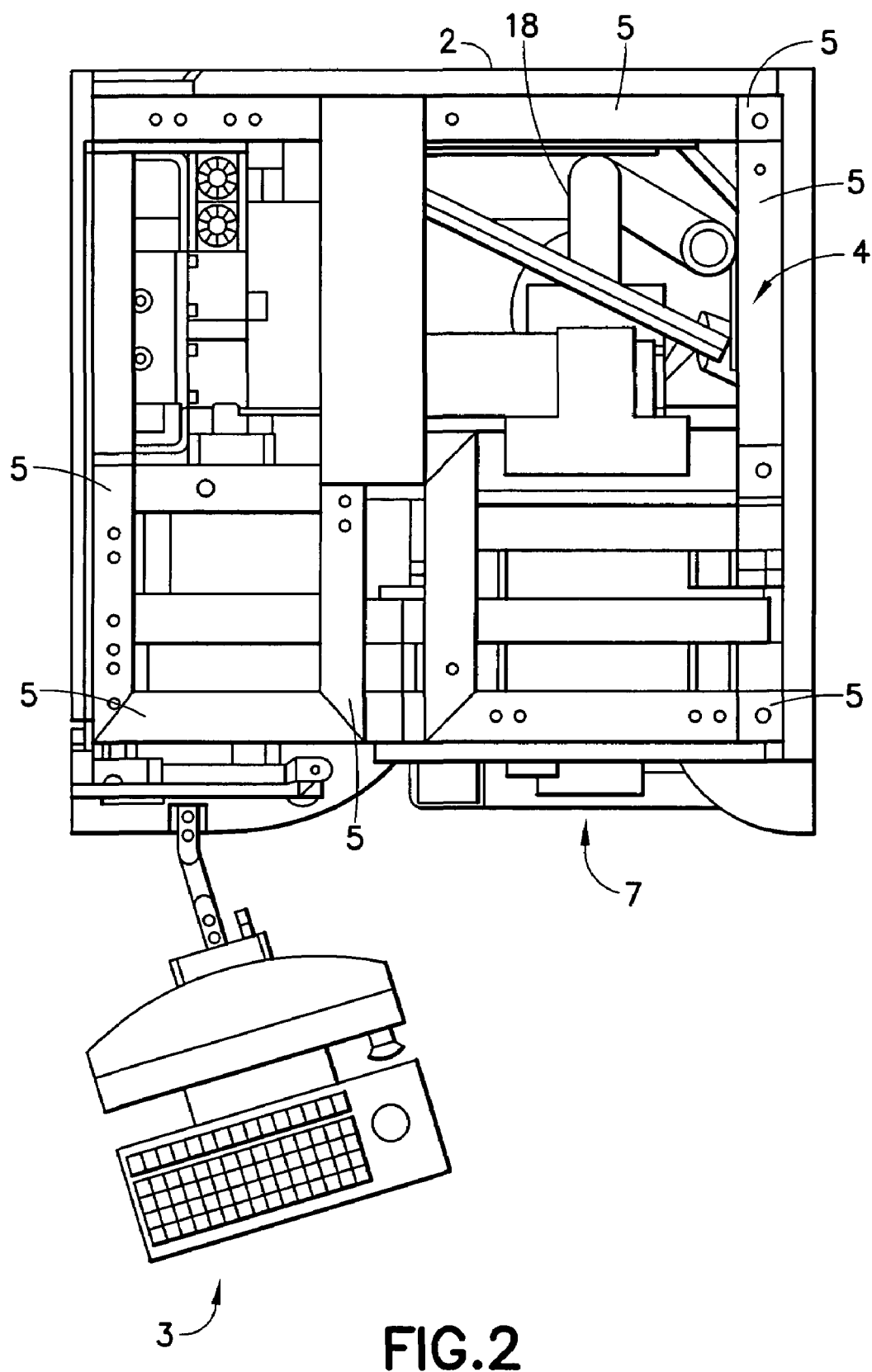
Figure 3:
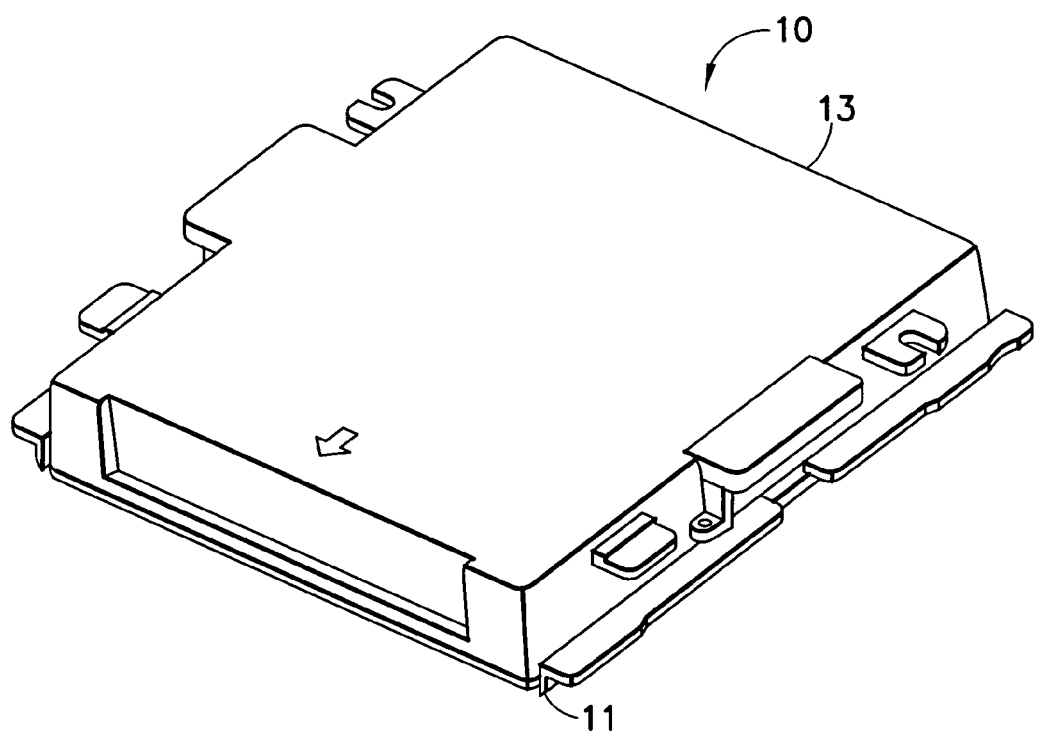
Figure 4:
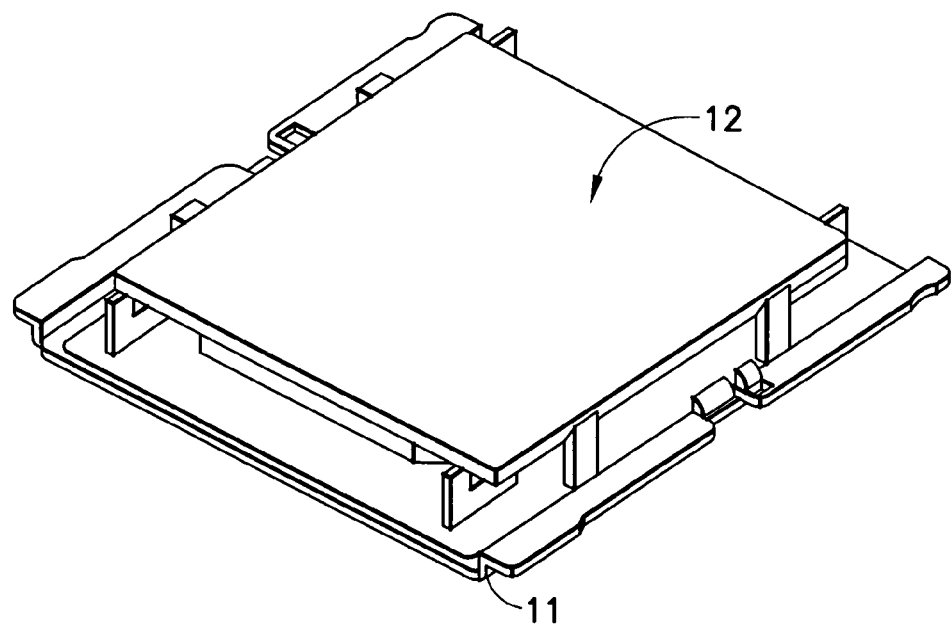
Figure 5:
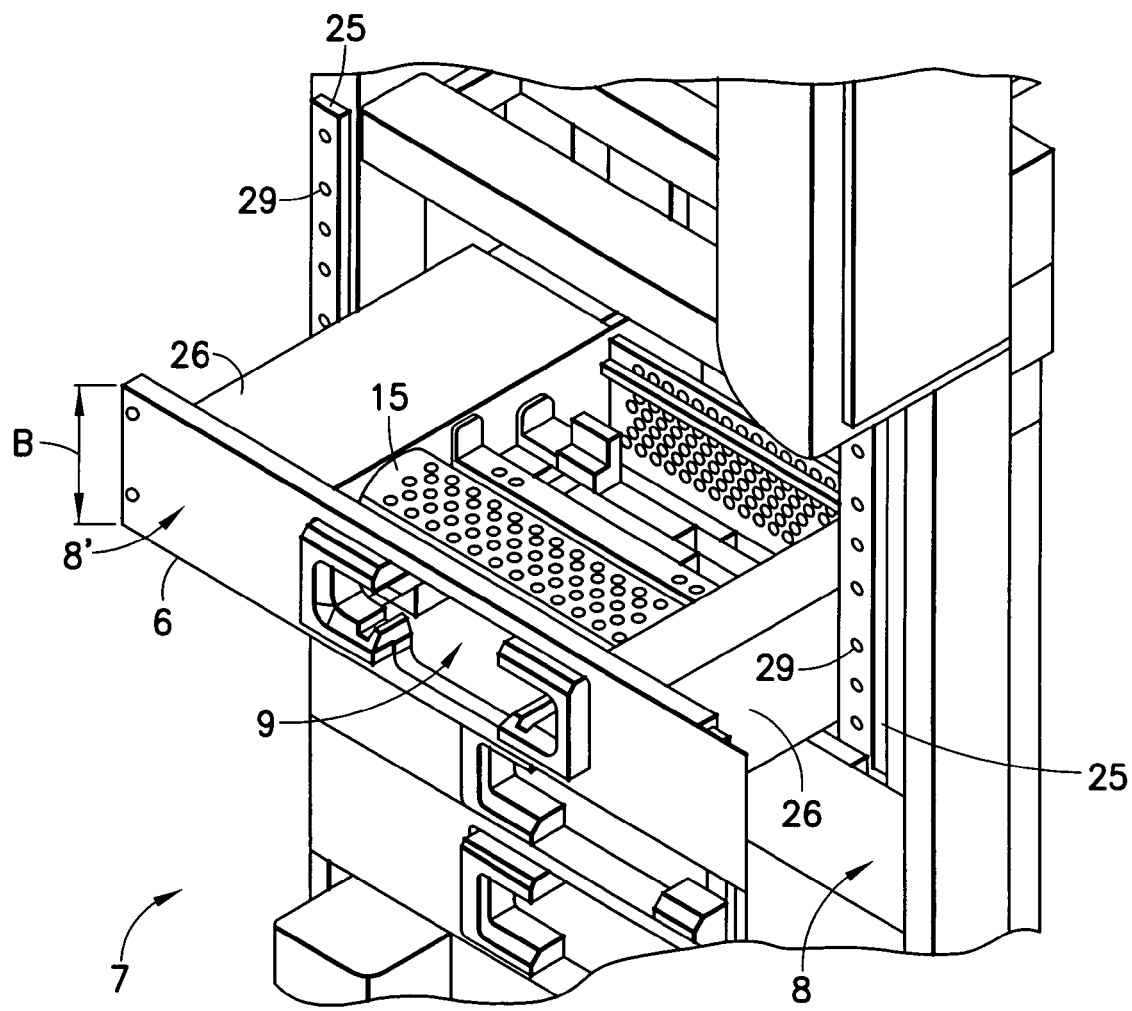
Figure 6:
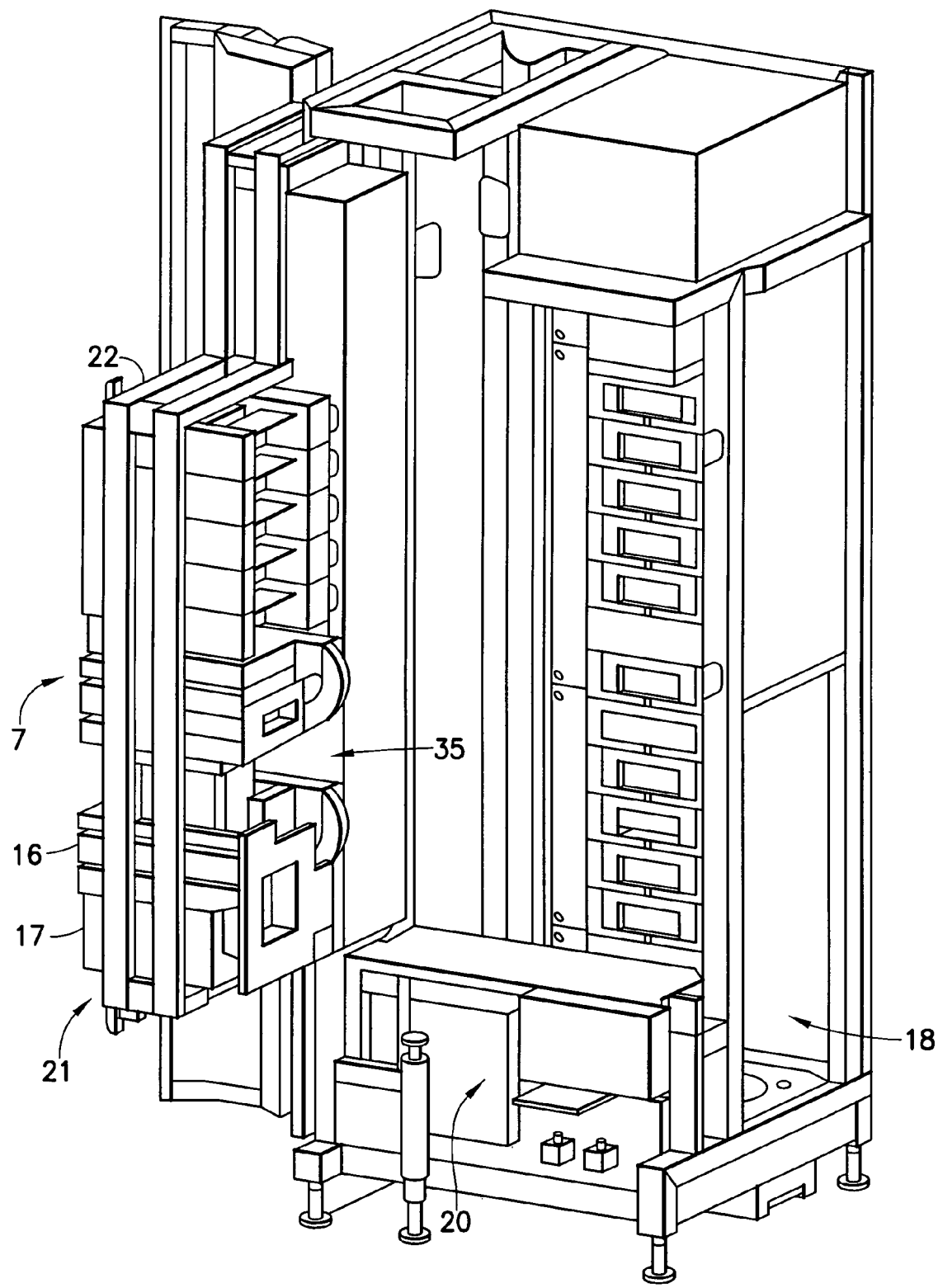
Figure 6A:
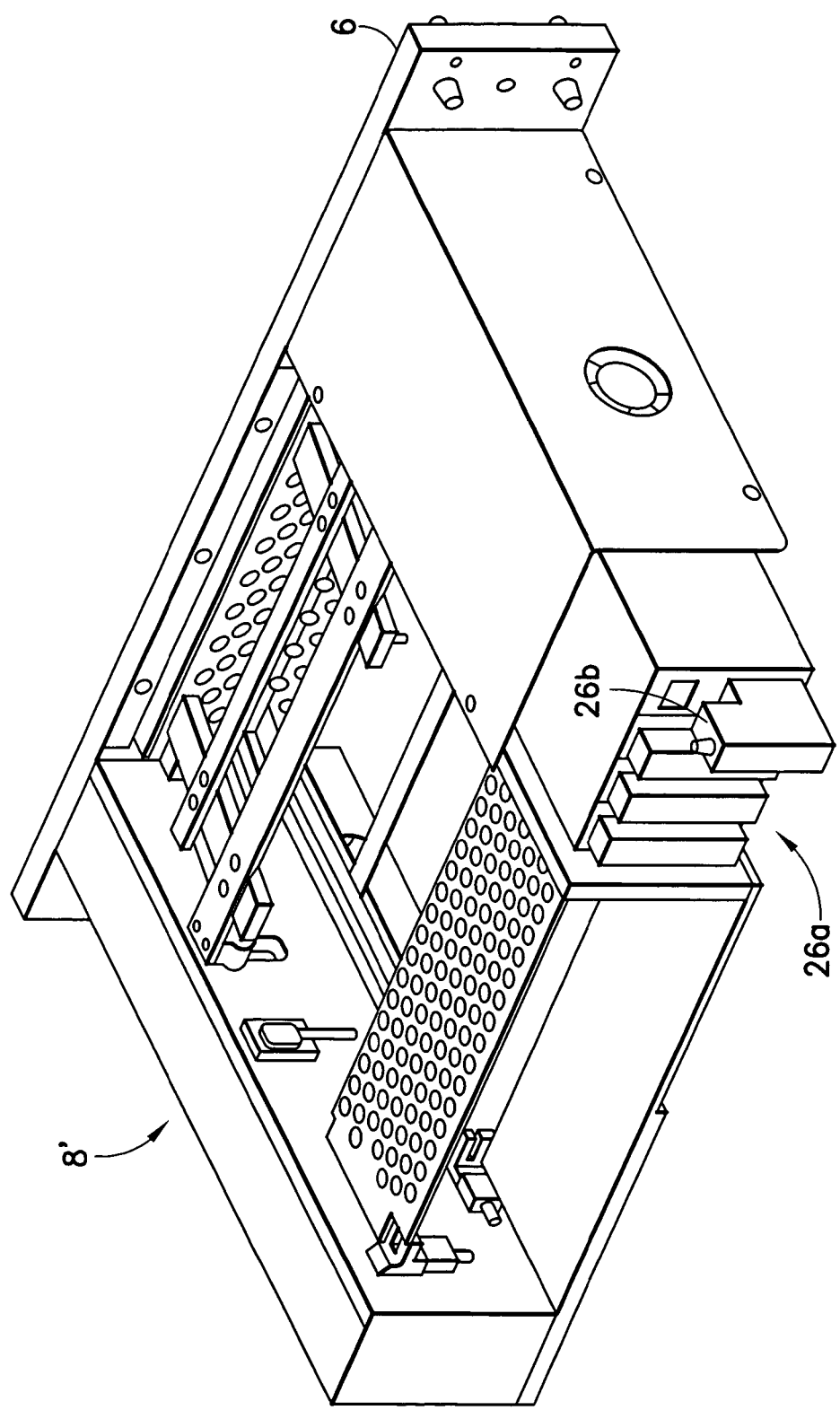
Figure 7:
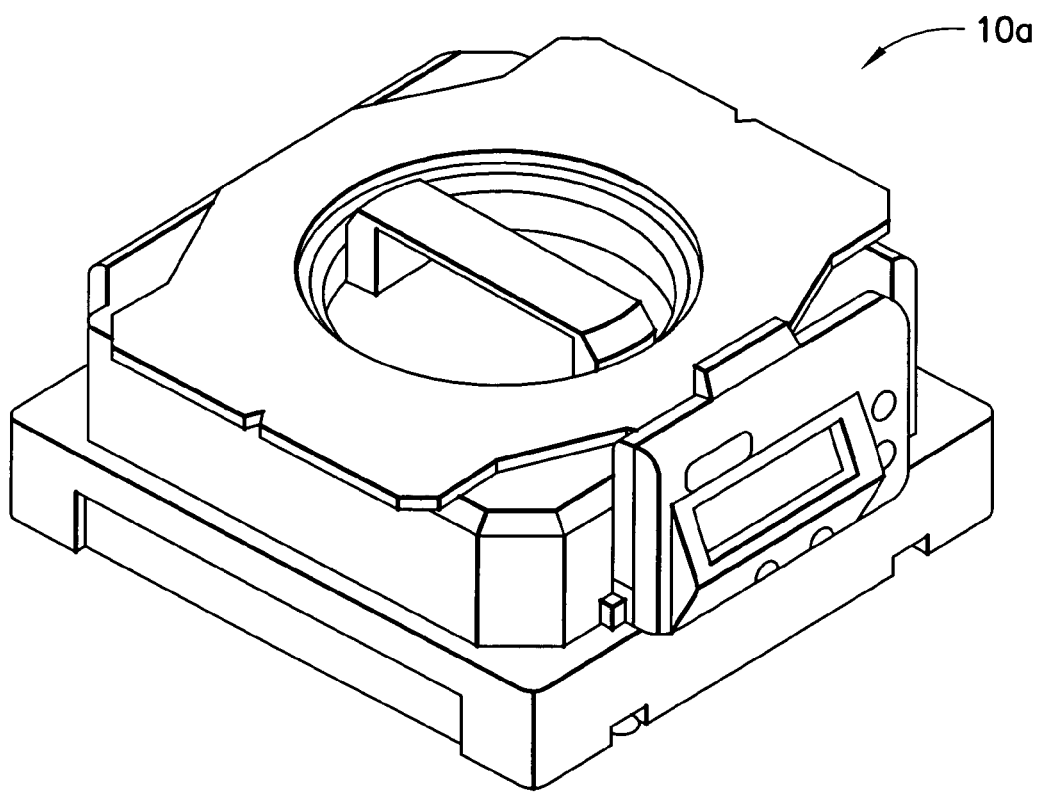
Figure 8:
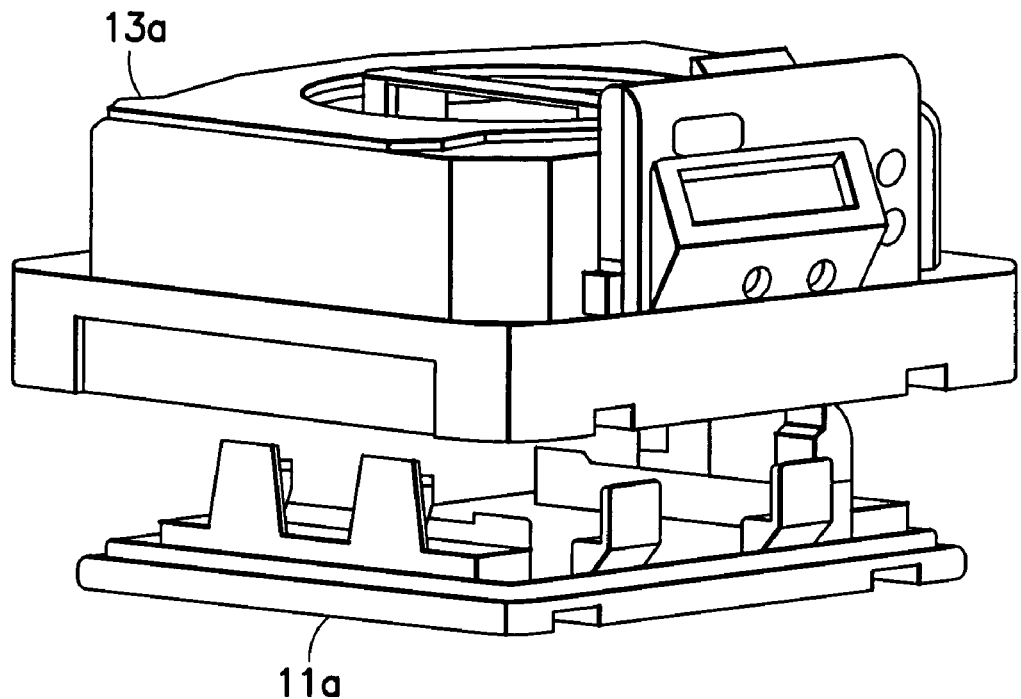
Figure 9:
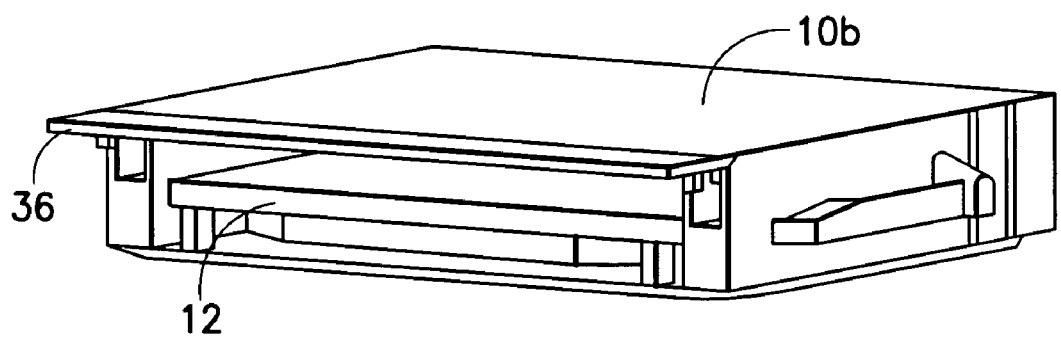
Figure 10:
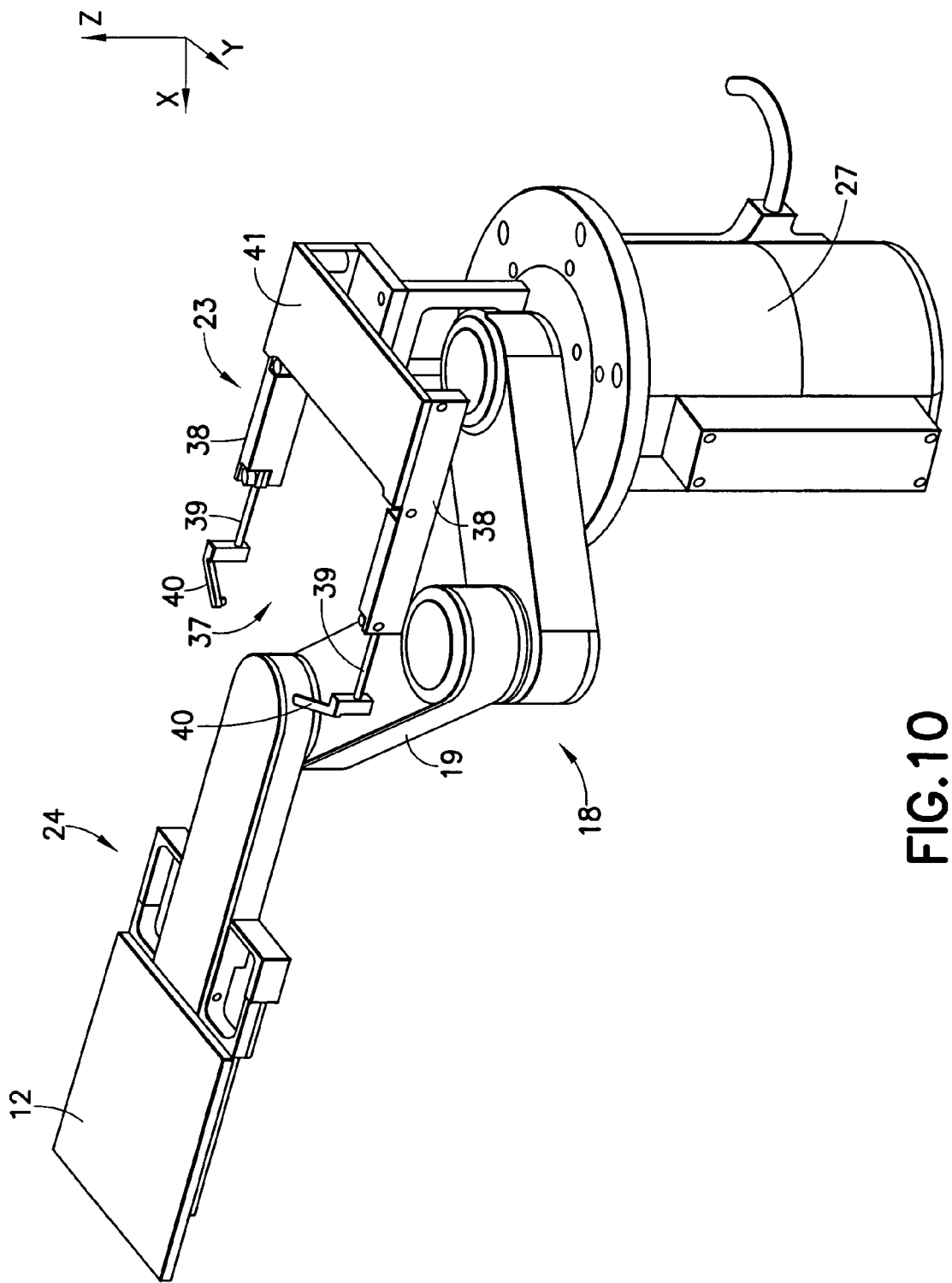
Figure 11:
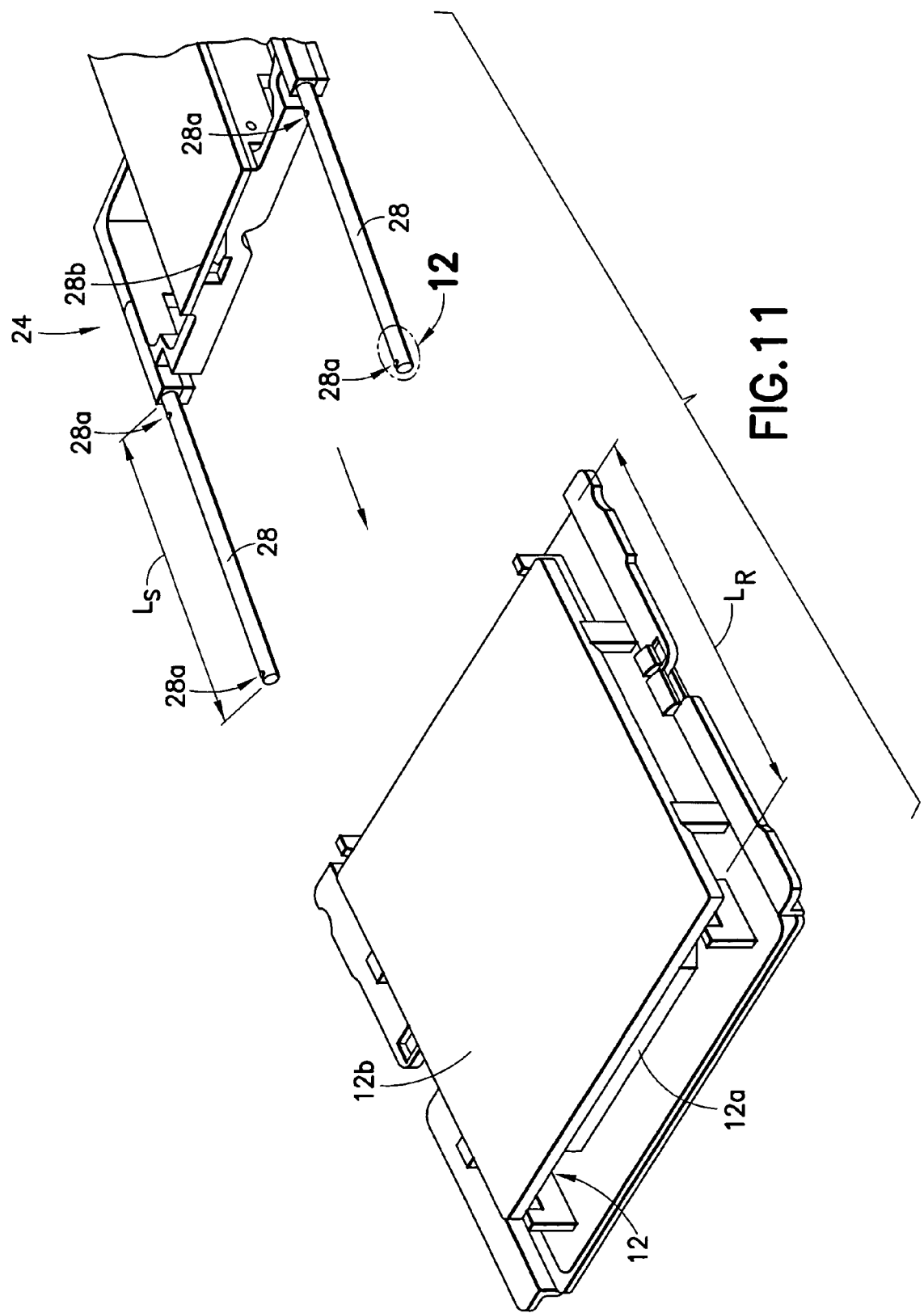
Figure 12:
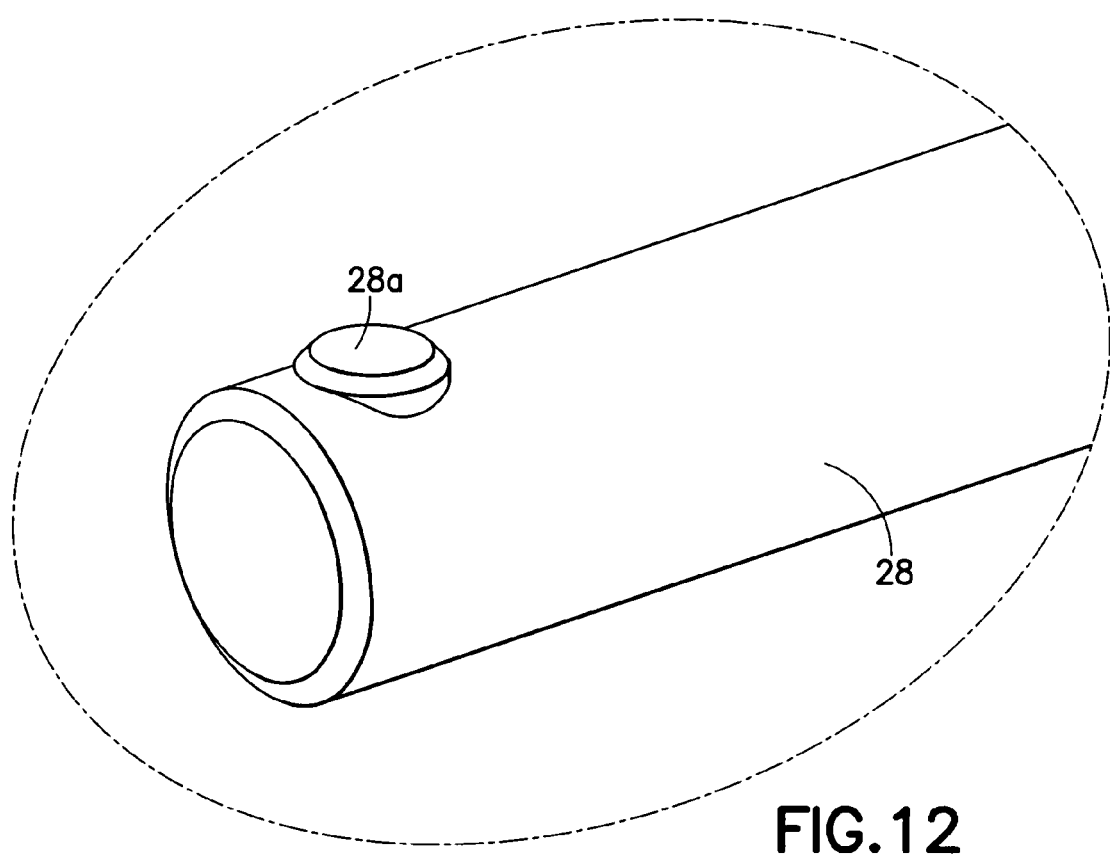
Figure 13:
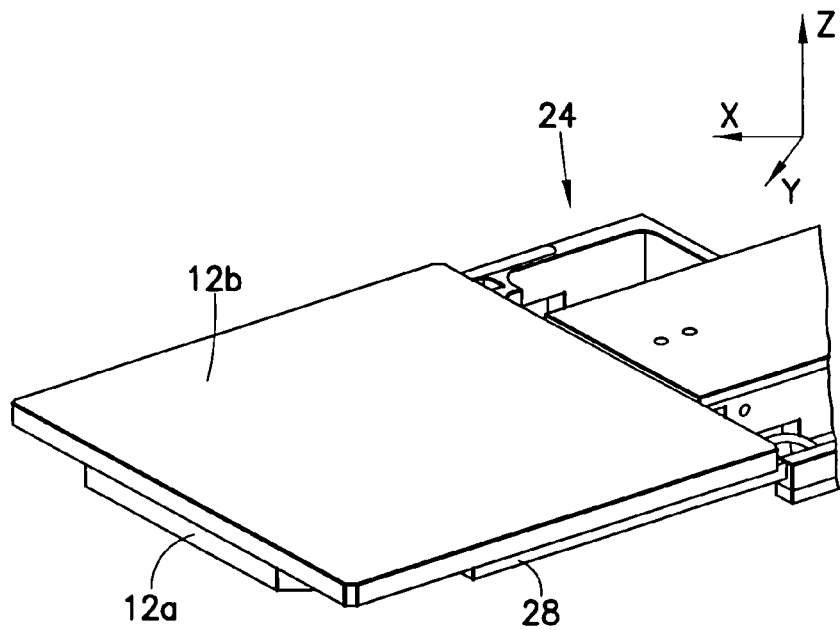
Figure 14:
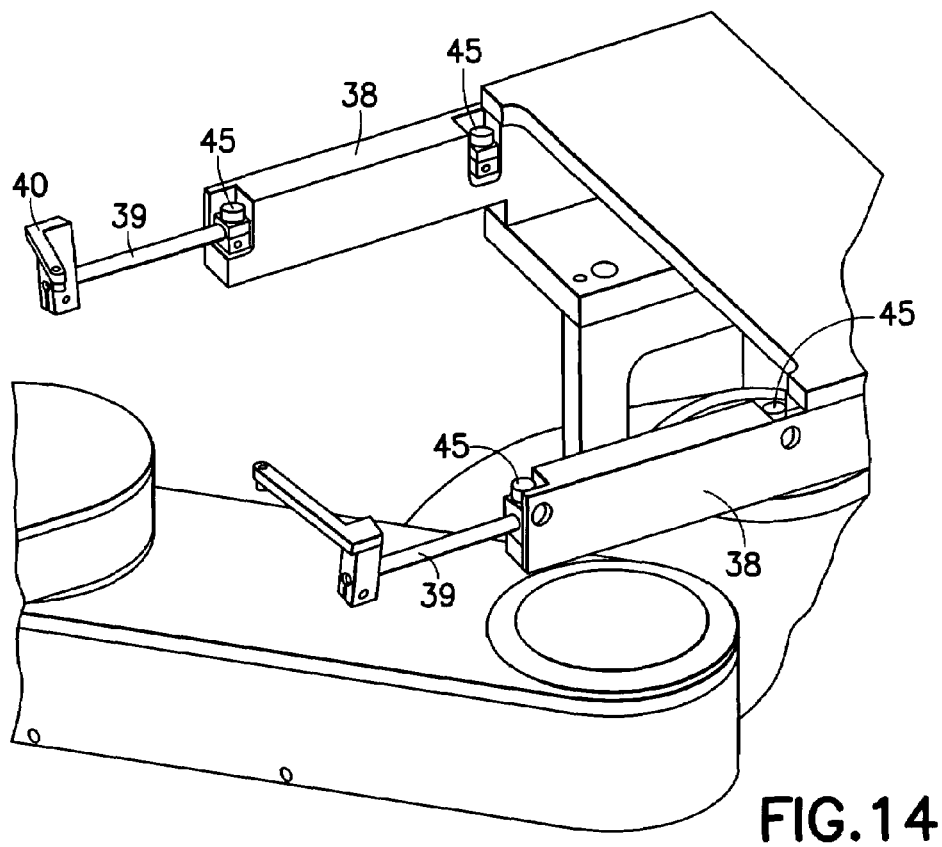
Figure 15:
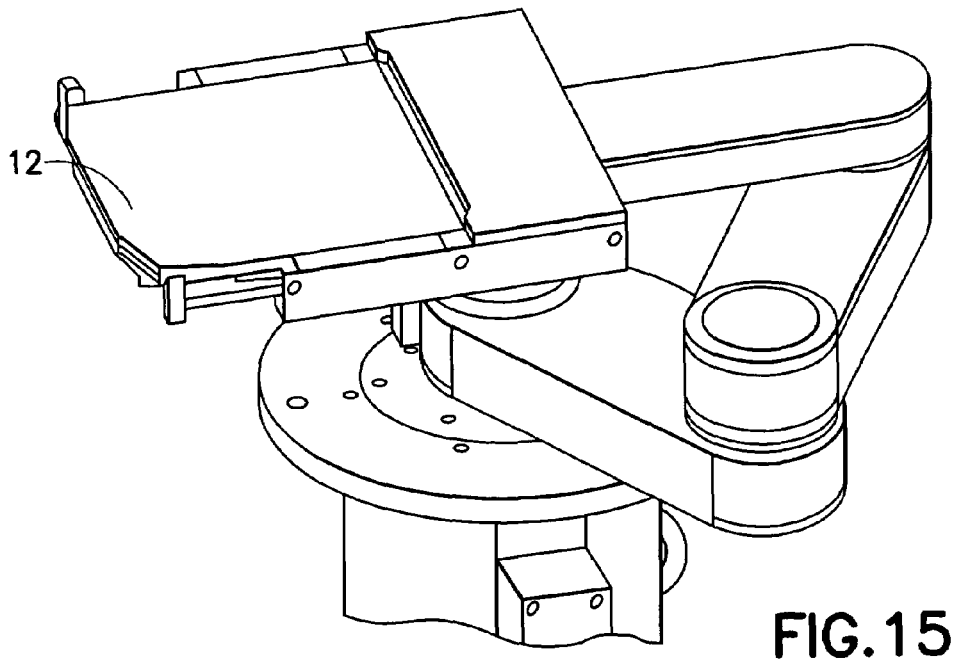
Figure 16:
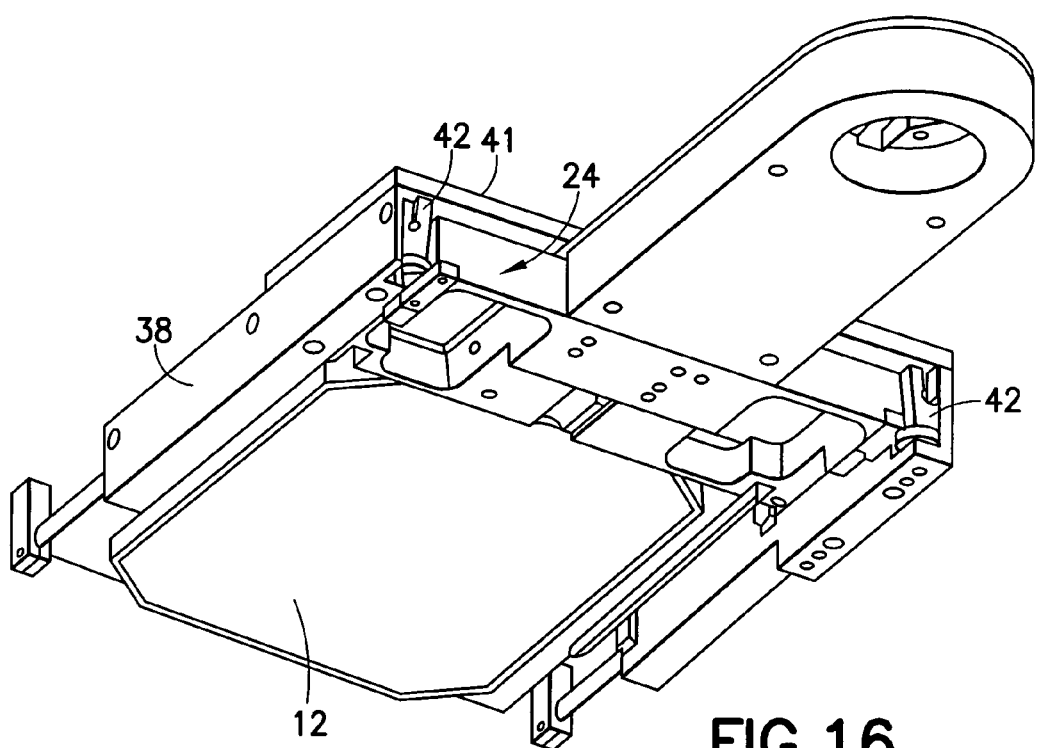
Figure 17:
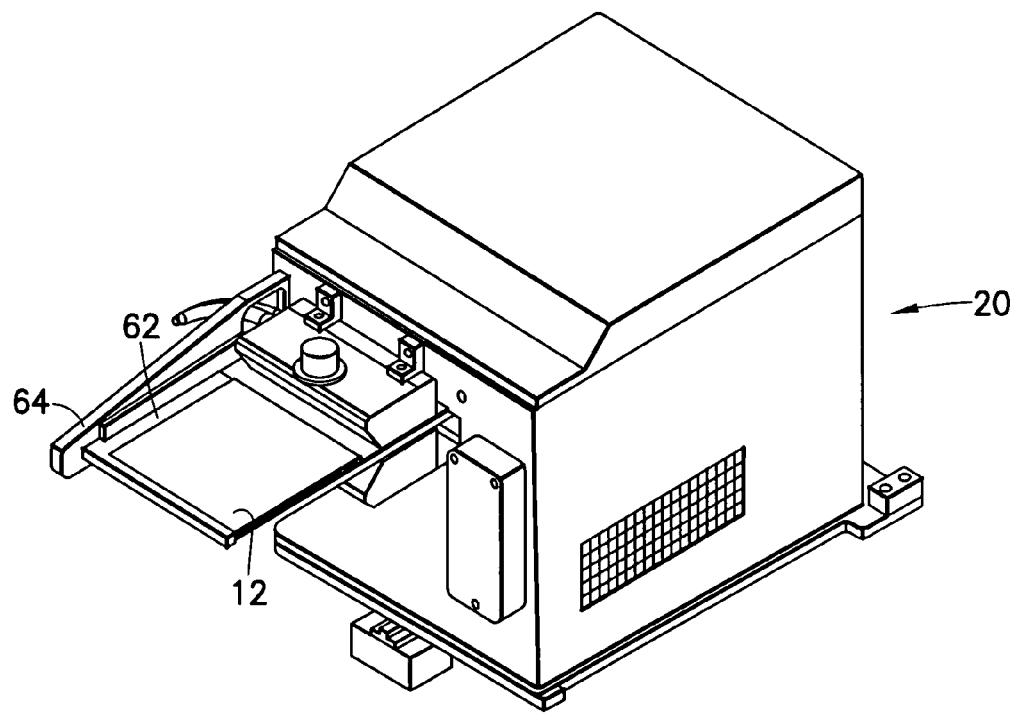
Figure 18:
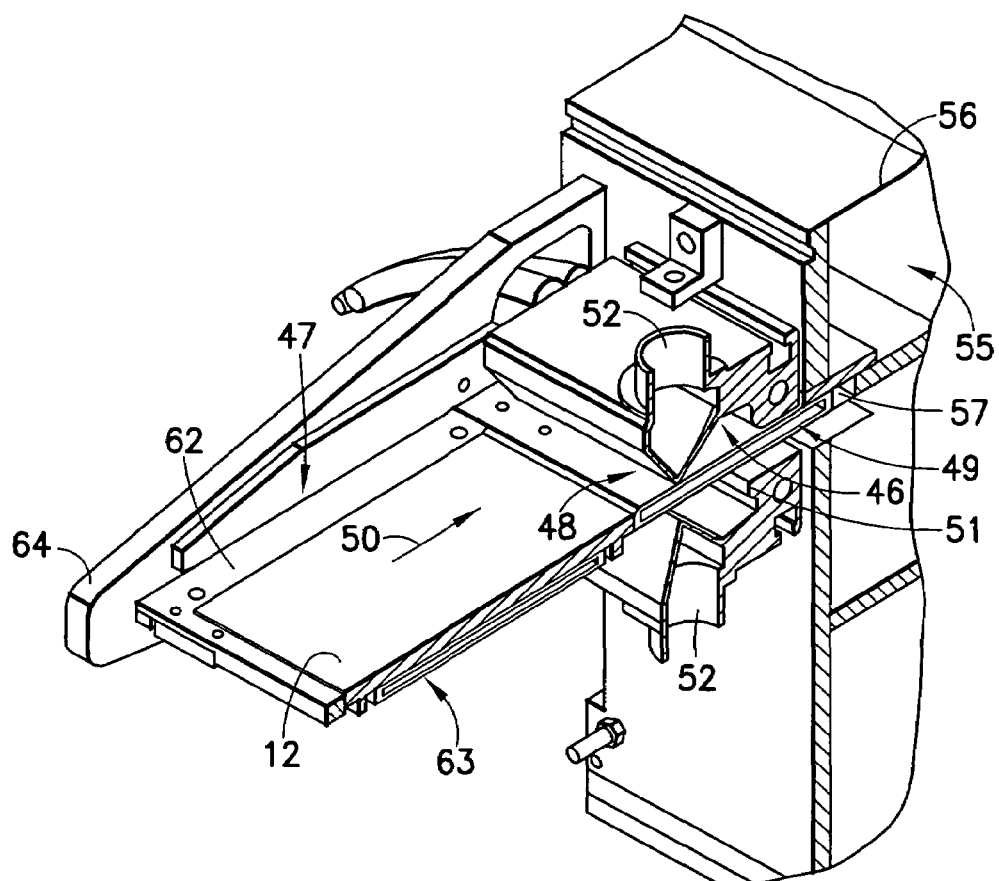
Figure 19:
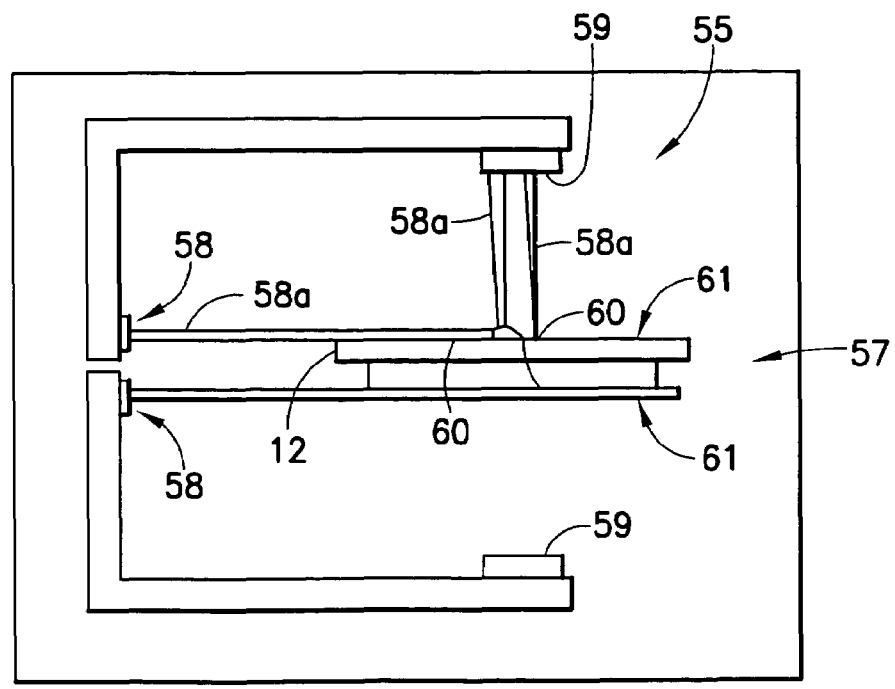
Figure 20:
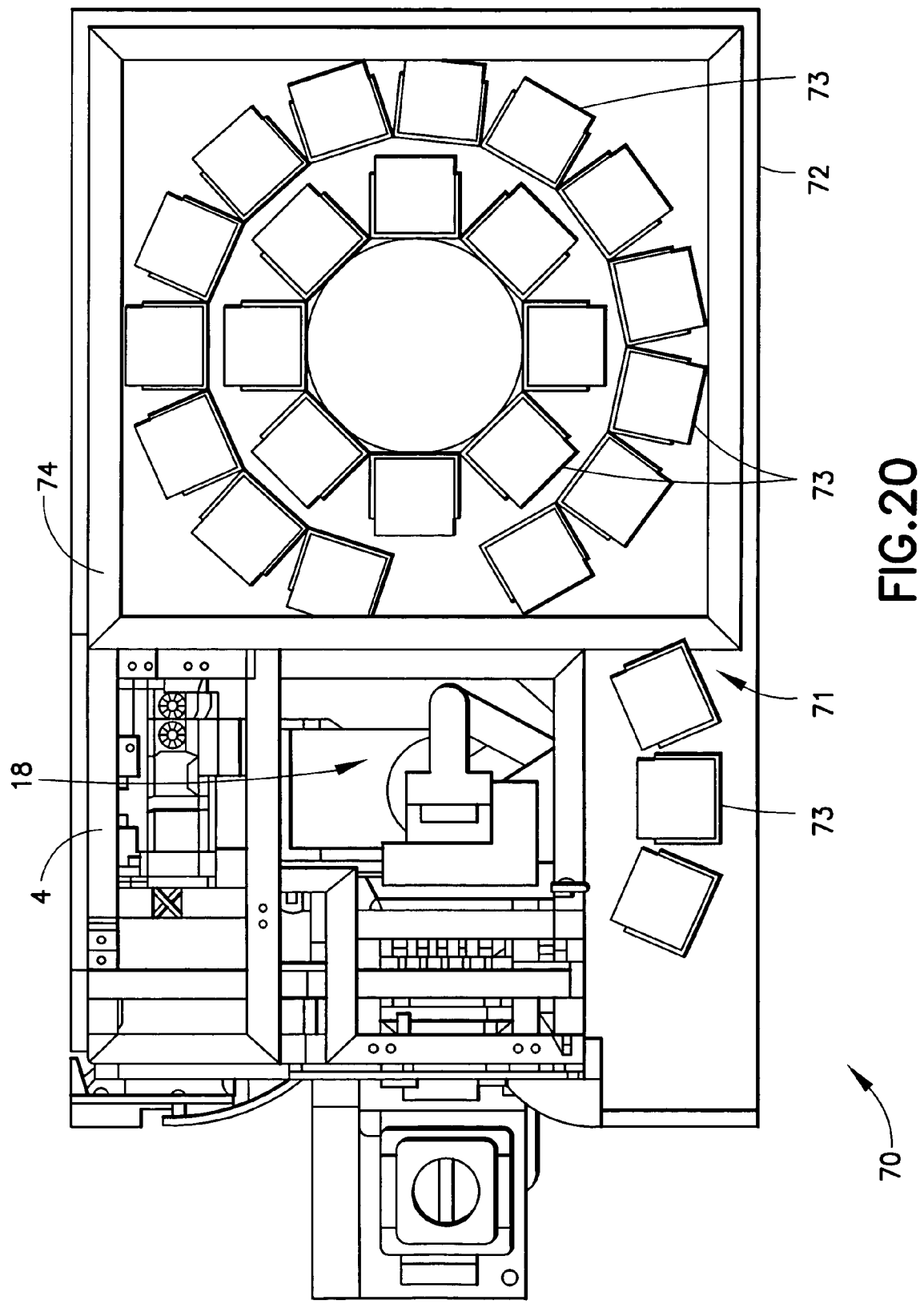
Figure 21:
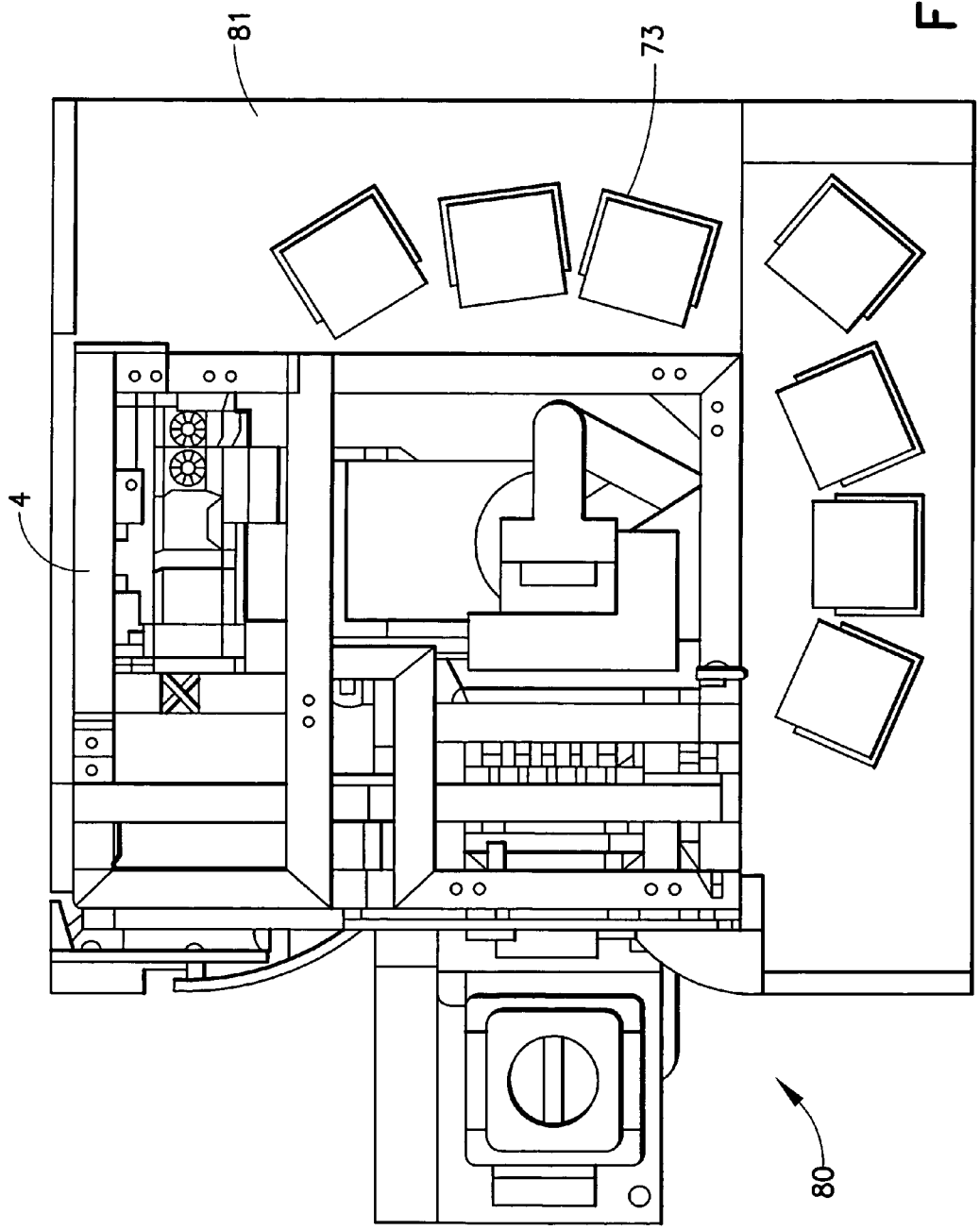
Figure 22:
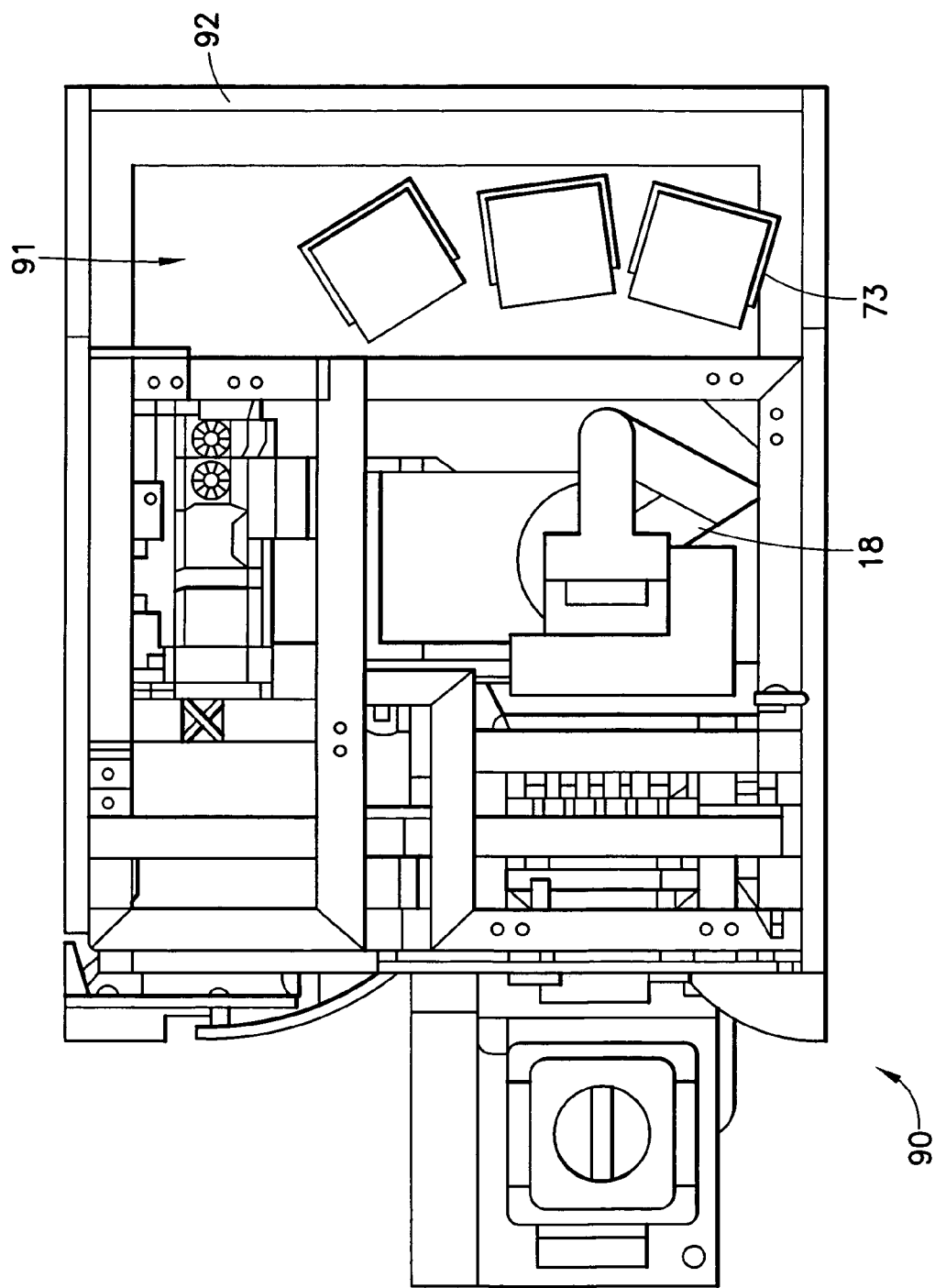

The invention is described in more detail on the basis of the examples of embodiment shown schematically in the figures, which show the following:

FIG. 1 a representation in perspective of a reticle manipulating device according to the invention;

FIG. 2 the reticle manipulating device of FIG. 1 in a top view;

FIG. 3 a transport box of the prior art in a closed state;

FIG. 4 the transport box of FIG. 3 in opened state;

FIG. 5 a partial representation in perspective of an input/output station according to the invention;

FIG. 6 a representation in perspective of the manipulating device of FIG. 1 according to the invention in opened state;

FIG. 6a a representation in perspective of an input/output unit from behind;

FIG. 7 a closed transport box in the form of an SMIF mono-pod;

FIG. 8 the transport box of FIG. 7 in opened state;

FIG. 9 a further transport box type with opened front flap;

FIG. 10 a representation in perspective of a reticle manipulating device according to the invention;

FIG. 11 a gripping part of the reticle manipulating device of FIG. 12 immediately prior to grasping a reticle;

FIG. 12 a detail representation of the gripping part along line XII from FIG. 11;

FIG. 13 the gripping part of FIG. 11 together with a reticle;

FIG. 14 a representation in perspective of a locking part of the manipulating device of FIG. 10;

FIG. 15 a representation in perspective in which the gripping part is inserted into the locking part;

FIG. 16 a perspective view of the gripper from below;

FIG. 17 a representation in perspective of a detection/cleaning unit of the manipulating device from FIG. 1 according to the invention;

FIG. 18 the cleaning part of the functional unit of FIG. 17 in a cross-sectional representation in perspective;

FIG. 19 a possible functional principle of the detection part of the functional unit of FIG. 17;

FIG. 20 another manipulating device according to the invention that belongs to the same system;

FIG. 21 another manipulating device according to the invention that belongs to the same system;

FIG. 22 another manipulating device according to the invention that belongs to the same system;

Shown in FIG. 1 and FIG. 2 is a reticle manipulating device 1 according to the invention, which is provided as a so-called "stand alone" device for integration into a production plant for electronic components, such as, for example, memory modules and processors. The manipulating device is provided with an essentially closed housing 2, which serves to maintain clean-room conditions within the space enclosed by the housing 2. For reasons of clarity in the drawing, a cover part of the housing is not shown in FIG. 1 and FIG. 2. In order to produce clean-room conditions, the manipulating device can be provided with a means for producing clean-room conditions, which is previously known in and of itself, and will not be described in more detail in the following. Arranged on one outer side of the housing is an input station 3, which is connected with a control of the manipulating device 1, which is not shown in more detail.

The housing 2 is attached to a rack 4 of the manipulating device, which is formed essentially from profiled tubes 5. The profiled tubes 5 offer diverse possibilities for the attachment either of additional profiled tubes or else of components of the manipulating device, in particular of functional units. To this end, the profiled tubes 5 are provided with recesses, preferably at predefined places in which screws or other fastening means can be arranged. Obviously, instead of recesses, it is also possible to provide other receiving means or fastening means arranged at predetermined sites.

This design contributes in a simple way in terms of construction to a modular design, which allows an assembly of different reticle manipulating devices by selection, in each case, of a partial set of functional units from a pregiven set of functional units and the integration thereof into a rack. In this way, rack 4 should also be structured as a modular system, which is comprised essentially of a limited number of different profiles 5 and joining elements. In the following, several of the many possible configurations of manipulating devices, each of which belongs to the same system, will be described by way of example.

The aspect of modularity also includes the fact that it is possible simply to remove or to install individual functional units in whole or in part from or into an already existing reticle manipulating device 1. In order to install and remove them, the functional units are merely to be connected at their mechanical and electrical interfaces with the respective reticle manipulating device or disconnected from it. This can take place, for example, for repair, maintenance, or subsequent replacement with other functional units.

Integrated into the front side of the housing 2 are several panels 6 of an input/output station 7. Each of the panels 6 belongs to one input/output unit 8, which, in itself, is also modular. One edge of an opening 9 of the respective panel 6 is provided with a contour that corresponds at least approximately to the outer contour of each type of transport box provided for the transport of reticles. The openings 9 are shaped in such a way that the transport box provided for the respective input/output unit 8 can be introduced through the corresponding opening 9. By way of example, a possible closed transport box 10 is represented in FIG. 3 and a reticle 12 lying on a bottom part 11 of an opened transport box 10 is represented in FIG. 4. As FIG. 5 shows, the panels are provided, in addition, with self-closing flaps 15. Accordingly, the danger of the penetration of particles through the corresponding opening 9 into the manipulating device exists for only a short time during the introduction or removal of a reticle.

Present as components of additional input/output units 8 of the input/output station 7 of FIG. 1 are two drawers 16, 17 of different structural heights, which can be pulled out. By means of each of these drawers 16, 17, it is possible to insert even larger transport boxes—for example, those than can accommodate more than one reticle—into the manipulating device 1. For reasons of clarity in the drawing, the panels of these two input/output units 8 are not shown in FIG. 1.

The manipulating device of FIG. 1 and FIG. 2 has, in addition, a manipulating device 18 in the form of a bent-arm robot (see also FIG. 10) arranged within the housing 2. The bent arm 19, which moves in a horizontal plane, is arranged so that it can travel along a vertical Z-axis, which is not shown in detail. Thus, the range of travel of the robot is fine-tuned to the arrangement of the individual components, in particular the functional units, of the manipulating device 1 in such a way the robot can receive the reticles 12 from any functional unit and transfer them to another functional unit. The bent-arm robot is provided with a gripper, which will be explained in more detail in the following, by means of which reticles 12 are received and held during their transport within the manipulating device.

In the example of embodiment represented in FIG. 1, a detection/cleaning device 20, arranged underneath the input/output station, is provided as another functional unit. This device is concealed in FIG. 1 by the housing 2, but is visible in FIG. 6. Another possible embodiment of a detection and cleaning device is shown in WO 02/01292 A1 of the same Applicant.

As is evident especially in the top view onto the manipulating device according to FIG. 2, each functional unit is spatially separated from the other functional units. This, too, facilitates the exchangeability and the engagement in the individual functional units.

Details of the construction of the input/output station 7 shown in the example of embodiment can be taken from the partial representation of FIG. 5 in combination with FIG. 6. In accordance therewith, the input/output station 7 has a door 21, which can be swung out and which forms a mounting frame 22. Spaced on the mounting frame 22 on vertical strips 25 with a specific basic grid size are recesses 29 to which the panels 6 of the input/output units 8 can be reversibly attached.

The input/output unit 8', which, as represented in FIG. 5, is inserted only partially into the frame, has a panel 6, the opening of which, 9, has a contour that is fine-tuned to a specific type of transport box. The input/output unit is further provided with two side pieces 26 with essentially rectangular cross section, in which drive units of the input/output unit are arranged, including, among other things, an opening/closing mechanism for the transport boxes. By way of the side pieces 26, each of the input/output units is inserted into and reversibly fixed in place in a compartment of the mounting frame 22, the shape of this compartment corresponding to the size of the input/output unit. In regard to electrical connections (electrical interface) for control and current supply, the input/output stations can be connected to the manipulating device by the same plug connectors in each case. To this end, each input/output unit is provided with a standardized, so-called VIPA module 26a, as is evident in FIG. 6a. The VIPA modules 26a of the input/output units always have the same plug connector 26b, with which the respective input/output unit can be connected in a simple way by only one (not shown) cable to the central control of the manipulating device 1. The drawers 16, 17 are also inserted into the compartments of the mounting frame 22 (FIG. 6). The drawers 16, 17 have in addition, input/output mechanisms, which are not shown in detail and which, in principle, are known from, for example, furniture drawers.

The width and depth of the side pieces 26 each time as well as their separation from each other are kept constant for all input/output units with front openings 9 in the panel 6. Only their height can be varied for adjustment of the panel height to different transport boxes. The variation of the height is only undertaken, however, in whole-number multiples of a basic grid size.

The width of the panels 6 is the same for all panels. In regard to their height, the panels 6 can be varied in whole-number multiples of a basic grid size B of the panels. This building-block modular construction also makes it possible for the input/output station 7 of a manipulating device according to the invention to be configured in different ways and to be adjusted to the respective requirements in each case. Moreover, it also makes it possible subsequently to retrofit input/output units 8, 8' in a very simple way for a new type of transport box, for example, in the unused plug-in compartments of the respective input/output station.

As in the first configuration example shown in FIG. 1, a second configuration example, which is not shown, also provides space for a maximum of twelve input/output units 8, each of which has the minimum structural height, corresponding to the basic grid size B. Here, in contrast to FIG. 1, twelve input/output units 8 are actually provided. These twelve input/output units 8 can be adapted to only one type of transport box. Alternatively, it can also be provided that input/output units be provided for at least two different types of transport boxes.

In a third configuration example for the input/output station 7 of the same reticle manipulating device 1, which is likewise not illustrated, the three upper input/output units 8 can be identical in construction and thus be provided, in turn, for the same type of transport box. The same holds true for the next two input/output units 8 down, which are also provided only for one type of transport box, albeit a different type of transport box than that which can be received by the input/output units in the manipulating device. The input/output units 8a provided for the so-called SMIF mono-pod transport boxes are also accordingly identical in construction to one another. Each of these input/output units has a structural height that corresponds to twice the basic grid size B.

The next input/output unit 8b is provided for so-called SMIF multi-pods and has a structural height that corresponds to five times the basic grid size B. Between the two input/output units 8a and 8b is an empty compartment, which is covered with a completely closed panel 6'. The height of the panel 6' corresponds to the basic grid size. In all configuration examples, the total structural height of the input/output stations is the same and corresponds to twelve basic grid sizes B. It can be seen from these configuration examples that the input/output units can be combined randomly with one another.

Regardless of the particular configuration, there is arranged in each input/output station a photosensor, which detects whether a transport box occupies a final position within the respective input/output unit 8, 8a, 8b. If this is the case, then, owing to a corresponding signal of the sensor, a control of the manipulating device 1 triggers a mechanism for automatic opening of the transport box. At the same time or beforehand, moreover, the front opening of the input/output station can be closed by means of the respective front flap 15 (FIG. 5), which can be coupled to a lever, which is not shown in detail.

Devices for opening reticle transport boxes are, in themselves, known in the prior art, for example, by the products Guardian Reticle Stocker, Colorado and Zaris of the company Brooks-Pri Automation Inc., Chelmsford (Mass.), USA, or its legal predecessors in title. In principle, opening mechanisms of this kind can be used for input/output units.

In the type of transport box 10 shown in FIG. 3 and FIG. 4, the opening process causes a catch between the bottom part 11 and a cover 13 of the transport box 10 to be released, the latter are separated from each other, and thus the reticle 12 arranged on the bottom part 11 is made accessible.

The input/output unit provided with the drawer 16 shown in, among others, FIG. 1 and FIG. 6, is provided for opening and closing of so-called SMIF mono-pod transport boxes 10a within the manipulating device. The bottom part 11a and the cover 13a of such a standardized SMIF mono-pod transport box 10a are shown in FIG. 7 and FIG. 8. The drawer, which can travel longitudinally in a horizontal direction, has a mechanism, which, in itself, is known, for opening this SMIF transport box, as is implemented, for example, in the products SMIF Lean Robot SLR150 or Ergospeed of the above-mentioned Brooks-Pri Automation, Inc. The opening mechanism of the product SMIF-LPT2150 offered by the company Asyst Technologies Inc., USA, is in principle just as suitable. The drawer 16 is provided with a plate 34 (FIG. 1) that is arranged within a frame, and the SMIF box 10a is arranged on this plate. After the drawer 16 has been pushed into the input/output station and the bottom part 11a of the SMIF transport box 10a is bolted to the plate 34, the plate 34, together with the bottom part 11a and a reticle situated therein (not shown in FIG. 8) is lowered. The cover 13a, by contrast, remains in fixed position. Accordingly, the respective reticle is accessible to the gripper from the back side 35 of the drawer or of the input/output station, lying within the housing 2 (see also FIG. 6).

In another type of transport box 10b, represented in FIG. 9, only one front flap 36 of the box is swung out to open the box, this likewise making accessible the reticle 12 that is arranged in the box 10b. An input/output unit, which is adapted to the type of transport box, is provided in the input/output station 7 in order to open and close this transport box.

Regardless of the actual configuration of the respective opening mechanism, a central control of the manipulating device coordinates, in addition, the introduction of the gripper, described in more detail below, by which the reticle is grasped and conveyed to a functional unit.

The universal reticle gripper represented in more detail in FIG. 10 is arranged on a manipulating device 18, which is constructed as a three-link bent-arm robot. All swiveling axes of the bent-arm robot run parallel to one another. A gripping part 24 of the manipulating device 18 is located on a free end of the bent arm 19, while a locking part 23 is fixed onto a platform 27 of the bent arm 19. The detailed representation of FIG. 11 shows that the gripping part has two rods 28, which are identical and are aligned parallel to each other, and are fixed relative to each other. Here the rods 28 are fixed in the gripping part 24 perpendicular to a stopping face 28b of the gripping part. In the example of embodiment shown in FIG. 11, the cross-sectional surfaces of the rods 28 are essentially round, the cross-sectional surfaces each having a diameter of approximately 4 mm. Obviously, other cross-sectional shapes can also be used in principle.

The length $L_S$ of the rods 28 is adapted to the reticles, which are standard in size, in such a way that their free length is shorter than the length of a side edge (length $L_R$) of the reticle in a direction parallel to the rods 28 (FIG. 11). The length $L_S$ of the rods should have a value that is less than the length $L_R$ of the reticle, but larger than half the length $L_R$. This makes the gripper especially well suited for removing reticles from different transport boxes.

In addition, upward pointing cams 28a are arranged on each rod 28, each in the region of both the front and back ends, and are provided as supports for reticles (FIG. 11 and FIG. 12).

When a reticle is grasped, its position on the gripping part 24 can be predetermined by its front-side contact with the stopping face 28b. Upon contact of the gripping part 24 with a reticle, the motor current increases. By monitoring the motor current, it is possible to detect such an increase by a control of the manipulating device 18 and, subsequently, the corresponding drive movement can be stopped. Alternatively or also in addition to this limitation of the movement of travel, a proximity sensor, which is not represented, can be provided, with which it can be established whether a reticle is present in the region of the stopping face 28b.

The locking part 23, shown in FIG. 10, of the manipulating device 18 is arranged at the same height relative to a vertical position of the gripping part 24. It has a bifurcated receiving member 37, whose two side pieces 38, which are aligned parallel to each other, have a separation that is only insignificantly larger than the width of a reticle. Arranged in each of the two side pieces 38 is a rod 39, which can rotate around its own lengthwise axis and which is provided, at its free end, with a swiveling lever 40. Each of the swiveling levers 40 can be swiveled into two final positions. In the open final position, the respective swiveling lever 40 releases the region between the two side pieces. In the locking final position, the two swiveling levers 40 are swiveled toward each other and thereby block the receiving member.

Arranged on the two side pieces 38 is a cross brace 41, which limits an insertion length of reticles between the two side pieces 38. As can best be seen from FIG. 16, a switch 42 is arranged in the region of the back end of the cross brace 41 on each of the two side pieces. When the switch 42 is actuated by the gripping part 24, rods 39 are rotated around their lengthwise axis. In this way, the rollers 45 (see FIG. 14) arranged in the side pieces 38 are tilted several millimeters in the direction of the respective opposite-lying side piece and the two swiveling levers 40 are swiveled from their original open final position (FIG. 14) to the locking final position (FIG. 15).

In order to grasp a reticle 12, the two rods 28 can travel below the glass plate of a reticle starting from one front side, so that the rods grasp the foot 12a of the reticle between them. This feed movement of the gripper is indicated in FIG. 11. Once the gripping part 24 has made contact with the front side of the reticle by the stopping face 28b, the current consumption of the electric motor of the bent-arm robot that produces the drive movement increases. In the present example of embodiment, this is used as a criterion for causing the control of the bent-arm robot to stop the feed movement.

By means of a subsequent travel movement along the Z-axis, the reticle 12 can then be lifted. The reticle 12 thus lies with the bottom side of its glass plate 12b on the cams 28a of the two rods 28, as represented in FIG. 13. Accordingly, the gripping part 24 is inserted into the locking part 23 of the gripper. The reticle 12 is hereby inserted between the two side pieces 38 into the receiving member by way of an essentially rectilinear movement of travel of the gripping part 24. This movement of travel can be achieved by coordinated swivel movements of all three swivel links.

Once the gripping part 24 has arrived under the cross brace in this way and has made contact with the two switches, the rods 39 and the swiveling levers 40 are swung into their locking final positions. Essentially at the same time, the rollers 45 are pressed outward, that is, pressed into the receiving member. The rollers 45 thereby clamp not only the reticle 12 between them by its lateral surfaces, but also center it in this way between the side pieces 38. In this final position, the gripping part 24 is thus situated with both rods in the receiving member 37. The reticle 12 continues to lie on the rods 28 in this process and is now ready for transport within the manipulating device by means of the gripper.

In order to set the reticle 12 down again at a specific site, the exact sequence is performed in reverse. A movement of the gripping part 24 in the direction of the swiveling lever 40 causes the switches 42 to be released. This brings about a release of the clamping of the reticle 12 by the rollers 45. Because, in addition, the swiveling levers 40 now free up the receiving member, the reticle can be guided out of the locking part 23 by means of a movement of the gripping part 24, which runs parallel to the rods 39.

The functional unit [called the] detection/cleaning device 20 of the manipulating device 1 of FIG. 1 according to the invention is shown in detail in FIGS. 17, 18, and 19. This one functional unit is mounted below the input/output station 7 on the rack 4. The detection/cleaning device 20 also has a cleaning chamber 46, which is shown in FIG. 18, into which, in each case by means of a feeding device 47, a reticle 12 is introduced through a first opening 48, and is conducted through the cleaning chamber 46 and can be taken out again through a second opening 49 at the other end of the cleaning chamber 46. In the cleaning chamber 46, it is possible, in the region of one back end of the cleaning chamber 46 in the feeding direction 50, to blow pure air or pure nitrogen in the form of one or several flows of air onto each side of the reticle from one or several nozzles 51. The pure air that is conducted over the reticle 12 entrains dirt particles situated on the reticle. The pure air is discharged once again from the cleaning chamber 46 through at least one suction channel 52 arranged on each side of the reticle in the vicinity of an insertion slot.

An ionization element, which is not shown in detail, is arranged in the direction of flow between the nozzles 51 and the respective suction channel 52. This is used to break down or prevent electrostatic charges by ionization of the air flow. Moreover, the structural layout of the part of the device 20 provided for cleaning is essentially identical to the device described in WO 02/01292 A1.

A detection unit 55 is arranged directly behind the cleaning chamber. As can be seen in FIG. 17 and FIG. 18, the cleaning chamber 46 can be fastened to the housing 56 of the detection unit 55. The latter has a housing with an insert gap 57. The two openings 48, 49 and the insert gap 57 lie at the same height and are thus flush with each other. The detection unit 55 that is used in connection with the example of embodiment is provided with two light sources 58 and two photosensors 59, with which the magnitude of a scattering of light 58a that is passed essentially parallel over the upper side of a reticle can be measured. The measurement of this magnitude makes it possible to draw conclusions as to the degree of still remaining contamination or as to the size of the dirt particles 60 that are situated on the bottom side 61 of the reticle 12. The functional principle of a detection unit of this kind is represented in FIG. 19 and is described in detail in WO 02/01292 A1. The disclosed content of WO 02/01292 is incorporated herein by reference, in regard to the structural layout and the mode of operation of the cleaning chamber and detection device described therein.

According to FIG. 18, a loading position of the feeding device is located directly in front of the first opening of the cleaning chamber. A carriage 62 of the feeding device 47 that can be loaded here with a reticle is essentially U-shaped. A reticle 12 can be inserted into the carriage 62 into an insertion opening 63 of the carriage by way of a horizontal movement of the gripping part 24. The carriage 62, fastened to a bearing arm 64, can be driven so as to travel back and forth along the arrow 50. The length of the travel movement extends from the loading position shown in FIG. 18 directly in front of the cleaning chamber up to a detection position within the detection unit 55. In the latter position, the reticle 12 is entirely arranged in the housing of the detection unit.

By a horizontal travel movement of the carriage in the direction of the insert gap 57, it is possible to introduce the reticle 12, after its cleaning in the cleaning chamber, into the detection unit 55 by way of a continuation of the same travel device. To this end, it is not even necessary to change the direction of the travel movement of the carriage 62. It is also not necessary to perform another manipulating step between the introduction of the reticle into the cleaning chamber 46 and the detection unit 55. It is thus possible, with only one travel movement and by only one clamping process, to introduce a reticle both into the cleaning unit and into the detection unit.

A second reticle manipulating device 70 is shown in FIG. 20, and this belongs to the same system as the reticle manipulating device 1 from FIG. 1. The example of embodiment of FIG. 20 has, as the basic module, the complete reticle manipulating device 1 of FIG. 1. However, the corresponding part of the wall of the housing 2 is removed on two sides, and a first example of embodiment of a "stocker module" functional unit is put into place. The stocker module 71 has a rack extension 74, which is screwed onto predetermined sites of the rack part 4 of the basic module. The outer sides of the rack extension 74 also bear parts of the housing 72, which is closed in the case of FIG. 20, in order to create and maintain a clean-room atmosphere within the manipulating device 70.

Arranged within the rack extension 74 are shelf units 73 in the form of two concentric circles. Each of these shelf units 73, which are mutually identical, has several compartments, which are arranged vertically on top of one another and are not shown in detail, in each of which a reticle can be intermediately stocked. Each of the circles can be formed so that it can rotate independently of the other circle. In this way, the individual shelf units can be brought into accessible positions, in which the opposite-lying manipulating device 18 can place reticles into each compartment and can remove them therefrom.

The stocker module also has three other shelf units 73, which are arranged next to one another on another adjacent side of the basic module. These shelf units are also in the accessible region of the manipulating device 18.

FIG. 21 shows another configuration of a manipulating device 80 that belongs to the same system. This one is also based on the basic module as presented in FIG. 1 and FIG. 2. Here, too, a rack extension 81 is introduced in a detachable manner on the rack part 4 of the basic module through a mechanical interface in the form of predetermined screw connections. In addition, the stocker module is connected to the basic module and in particular to the control of the manipulating device through an electrical interface, which is not shown in detail. In the stocker module of FIG. 21, a smaller number of shelf units than in FIG. 20 are utilized, but these are in principle the same ones. However, in the example of embodiment of FIG. 21, the shelf units are arranged around one corner of the basic module.

FIG. 22 also shows another example of embodiment of a manipulating device 90 according to the invention. This one also is based on the same basic module and has another variation of a stocker module 91 in order to expand the function of the basic module. Once again, the shelf units 73 already shown in FIG. 20 are arranged in a rack extension 92, which is fastened via an interface to the rack part 4 of the same basic module. In this example of embodiment, the shelf units 73 are mounted along a lengthwise side of the basic module in the region of the manipulating device 18.

What is claimed is:

1. A detection/cleaning device for reticles employed in the production of electronic components, wherein the detection/cleaning device has a closable housing capable of holding a controlled atmosphere therein and having at least one closable loading opening for loading and unloading reticles into the closable housing; a cleaning unit, inside the closable housing and in which a cleaning chamber is constructed, at least one gas feed for introducing a pressurized fluid cleaning medium opens into the cleaning chamber, and at least one suction channel, through which the gas can be discharged from the cleaning chamber, leads from the cleaning chamber, wherein the cleaning chamber has at least one first opening for introducing and removing a reticle, is further provided with a detection unit for detecting contaminants on articles used in semiconductor production, wherein, to this end, the detection unit has a detection device located inside the closable housing, into which a reticle can be introduced from one feed side of the detection unit, wherein the first opening of the cleaning chamber and the feed side lie on opposite sides of the cleaning chamber from each other, and is provided with a feeding device, constructed so as to provide solely for exchanging a reticle between the cleaning unit and the detection unit.

2. The detection/cleaning device according to claim 1, in which the feeding device is provided with only one axis of movement.

3. The detection/cleaning device according to claim 2, in which the feeding device is provided with only one axis of linear travel.

4. The detection/cleaning device according to claim 1, further characterized in that an opening is provided for the cleaning chamber on each of the opposite-lying sides, wherein a reticle can be introduced into the cleaning chamber through both openings by input and output.

5. The detection/cleaning device according to claim 4, further characterized in that one of the openings lies directly opposite a recess of the housing of the detection unit for feeding in a reticle.

6. The detection/cleaning device according to claim 1, further characterized in that the feeding device has a movable holding part in which a reticle can be arranged in a clamp and the reticle can be introduced into both the detection unit and the cleaning chamber in only this one clamp.

7. A substrate processing apparatus comprising:

a closable housing arranged so that the housing is capable of holding an isolated atmosphere isolated from an exterior atmosphere outside the housing;

a reticle cleaning device connected to and located in the housing, the cleaning device having a reticle cleaning chamber defined therein, the cleaning chamber having a side with an opening located within the housing, through which a reticle is transported in and out of the cleaning chamber;

a detection device connected to and located in the housing, the detection device being adapted to detect contaminants on the reticle and disposed in the housing on a different side of the cleaning chamber from the side with the opening; and a transport device movably connected to and located in the housing, the transport device being capable of transporting the reticle between the reticle cleaning device and the detection device;

wherein the reticle cleaning device and the detection device are arranged so that the transport device feeds the reticle into the detection device through the opening of the cleaning device.

* * * * *